(12) United States Patent
Elam et al.

(10) Patent No.: US 11,414,756 B2
(45) Date of Patent: Aug. 16, 2022

(54) METHOD OF CREATING STRUCTURE FOR PARTICLE DETECTION IN TIME PROJECTION CHAMBERS AND PHOTODETECTORS

(71) Applicant: UCHICAGO ARGONNE, LLC, Chicago, IL (US)

(72) Inventors: Jeffrey W. Elam, Elmhurst, IL (US); Anil U. Mane, Naperville, IL (US); Stephen Magill, Downers Grove, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 17/038,944

(22) Filed: Sep. 30, 2020

(65) Prior Publication Data

US 2022/0098734 A1    Mar. 31, 2022

(51) Int. Cl.
C23C 16/455 (2006.01)
C23C 16/06 (2006.01)
C23C 16/40 (2006.01)
C23C 16/22 (2006.01)

(52) U.S. Cl.
CPC ........ *C23C 16/45553* (2013.01); *C23C 16/06* (2013.01); *C23C 16/22* (2013.01); *C23C 16/403* (2013.01)

(58) Field of Classification Search
CPC ... C23C 16/45553; C23C 16/22; C23C 16/06; C23C 16/403
See application file for complete search history.

(56) References Cited

U.S. PATENT DOCUMENTS

| | | | |
|---|---|---|---|
| 2012/0009785 A1* | 1/2012 | Chandrashekar | C23C 16/045 438/669 |
| 2012/0187305 A1* | 7/2012 | Elam | C23C 16/45555 250/390.01 |
| 2014/0220244 A1* | 8/2014 | Mane | C23C 16/45544 427/209 |
| 2019/0096623 A1* | 3/2019 | Wagner | B29C 64/135 |

OTHER PUBLICATIONS

Alvarez, et al., "Ionization and scintillation response of high-pressure xenon gas to alpha particles," Journal of Instrumentation 8(5), P05025, 36 pages (2013).

(Continued)

*Primary Examiner* — Elizabeth A Burkhart
(74) *Attorney, Agent, or Firm* — Foley & Lardner LLP

(57) ABSTRACT

Time projection chambers are useful for high energy particle physics, nuclear physics, and astronomy. To enhance the particle detection efficiency and performance of the projection chambers functional bilayer thin film coatings based on the atomic layer deposition method are utilized. Coating material selection is based on Auger neutralization process ion induced electron emission from metallic surfaces (e.g., Mo or W) combined with a high secondary electron emission coefficient. Application of high secondary electron emission materials (e.g., MgO and CaF2) enhances the multiplication of these emitted electrons from ion induction processes. Therefore, using suitable bilayer coatings the overall TPC signal detection efficiency can be increased.

16 Claims, 11 Drawing Sheets

(56) References Cited

OTHER PUBLICATIONS

Arazi, "On the possibility of positive-ion detection in gaseous TPCs and its potential use for neutrinoless double beta decay searches in 136Xe," Journal of Physics: Conference Series 1029, 17 pages (2018).
Arazi, et al., "First observation of liquid-xenon proportional electroluminescence in THGEM holes," Journal of Instrumentation 8(12), C12004, 17 pages (2013).
Arazi, et al., "THGEM-based detectors for sampling elements in DHCAL: laboratory and beam evaluation," Journal of Instrumentation 7(5), C05011, 18 pages (2012).
Choi, et al., "Measurement of Secondary Electron Emission Coefficient (?) of MgO Protective Layer with Various Crystallinities," Japanese Journal of Applied Physics 37(1)(12B), pp. 7015-7018 (1998).
Hagstrum, "Auger Ejection of Electrons from Molybdenum by Noble Gas Ions," Physical Review 104(3), pp. 672-683 (1956).
Hagstrum, "Auger Ejection of Electrons from Tungsten by Noble Gas Ions," Physical Review 96(2), pp. 325-335 (1954).
Hagstrum, "Theory of Auger Ejection of Electrons from Metals by Ions," Physical Review 96(2), pp. 336-365 (1954).
Matulevich & Van Emmichoven, "Electron emission from low-energy Xe ions interacting with a MgO thin film deposited on a Mo substrate," Physical Review B 69(24), 245414, 7 pages (2004).
Matulevich, et al., "Low-Energy Ion-Induced Electron Emission from a MgO(100) Thin Film: The Role of the MgO-Substrate Interface," Physical Review Letters 89(16), 167601, 4 pages (2002).

* cited by examiner

RMS roughness = 0.6nm for 50nm

RMS roughness = 3.2nm for 70nm

METHOD OF CREATING STRUCTURE FOR PARTICLE DETECTION IN TIME PROJECTION CHAMBERS AND PHOTODETECTORS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to atomic layer deposition, specifically deposition of thin films for particle detectors.

BACKGROUND

A time projection chamber ("TPC") is a detector used in elementary particle and nuclear physics experiments to identify and characterize, for example, three-dimensional trajectories and momentum of particles produced in fundamental interactions. It accomplishes this by using a combination of electric and magnetic fields in a volume of a sensitive liquid or gas to drift electrons and/or positive ions produced in particle interactions towards a position-sensitive collection layer consisting of wires or pixel sensors. TPCs are the central tool in experimental high energy physics, nuclear physics, and astroparticle physics, providing detailed three-dimensional images of ionization tracks produced by charged particles passing through their sensitive volume.

In a basic TPC scheme, ionization electrons liberated along a track are drifted towards a position-sensitive readout plane, where the track image is reconstructed. TPC devices utilize two primary detection schemes. In negative ion TPC ("NITPC"), the process uses electronegative molecules (gas) to rapidly capture the electrons generated along an ionization track. The resulting negative ions are then drifted towards a readout plane where they are stripped of their extra electrons, which subsequently undergo avalanche multiplication in an appropriate amplification structure. A positive ion TPC ("PITPC") operates as a complementary approach to suppress electron diffusion. The positive ion detection in atmospheric and high-pressure gaseous TPCs uses potential emission of secondary electrons from surfaces by the impinging ions. The emitted electrons can be used to generate localized light or charge signals, recorded by position-sensitive readout.

Various attempts have been made to enhance the particles' detection sensitivity/efficiency through TPCs. Recently, it has been reported that there is a possibility of an efficient way to enhance performance based on a neutralization process. The neutralization of a slow positive ion on a clean solid surface occurs primarily by means of two basic mechanisms: resonance neutralization ("RN") and auger neutralization ("AN"). Ion-induced potential emission of electrons from solid surfaces was extensively studied by H. D. Hagstrum, who focused on tungsten (W) and molybdenum (Mo) metal and semiconductors (silicon (Si) or germanium (Ge)). In the case of insulating oxides ion, induced potential emission of electrons is more difficult due to charging effect. A systematic study was demonstrated previously where 1-5 nm thick magnesium oxide (MgO) on Mo(001) using a beam of 40 eV singly charged noble gas ions with very low current to avoid charging-up effects.

Thus, the ability to achieve an insulating oxide coating is desirable for TPCs. Various deposition techniques (e.g., molecular-beam epitaxy ("MBE"), electron beam evaporation ("EBE"), thermal evaporation, pulsed laser deposition ("PLD"), and chemical vapor deposition ("CVD")) have been used with alkaline earth metal fluorides, including calcium fluoride ($CaF_2$). However, the use of atomic layer deposition ("ALD") has proved difficult for these materials. There remains a need for an ALD process for coating metal oxides on substrates for use in TPCs.

SUMMARY

At least one embodiment relates to a method of forming a secondary electron emissive coating comprising providing a mesh substrate within an atomic layer deposition reactor and depositing a coating of Mo or W by an atomic layer deposition process.

Another embodiment relates to a method of forming a secondary electron emissive coating comprising providing a mesh substrate within an atomic layer deposition reactor, depositing a coating of Mo or W by an atomic layer deposition process, and depositing a topcoat by a second ALD deposition process. The first ALD deposition process includes at least one cycle of pulsing a first metal precursor selected from the group consisting of molybdenum(V) chloride, tunsten(V) chloride, (bicyclo[2.2.1]hepta-2,5-diene) tetracarbonylmolybdenum(0) bis(cyclopentadienyl)molybdenum(IV) dichloride, tungsten diazabutadiene, molebdenum diazabutadiene, Molybdenum(VI) Dioxide bis (2,2,6,6-tetramethyl-3,5-heptanedionate) Molybdenumhexacarbonyl, Cyclopentadienylmolybdenum(II) tricarbonyl, Bis(tert-butylimino)bis(tert-butylamino)tungsten, Tungsten hexacarbonyl, Tetracarbonyl(1,5-cyclooctadiene)tungsten (0), Bis(isopropylcyclopentadienyl)tungsten(IV) dihydride, Bis(t-butylimido)bis(dimethylamino)molybdenum(VI), Bis (ethylbenzene)molybdenum, Cycloheptatriene molybdenum tricarbonyl a W or Mo precursor into the reactor for a first metal precursor pulse time, forming a first adsorbed entity on the substrate; purging the reactor of the first metal precursor; pulsing a first reducing precursor selected from the group consisting of $SiH_4$, $H_2$, $NH_3$, $Si_2H_6$, Hydrazine, TMA, $B_2H_6$ into the reactor for a second precursor pulse time, the second precursor reacting with the first adsorbed entity; and purging the reactor of the co-reactant precursor. The second ALD deposition process includes at least one cycle of pulsing a second metal precursor comprising a magnesium ALD precursor for a second metal precursor pulse time, forming a second adsorbed entity on the W or Mo coating; purging the reactor of the second metal precursor; pulsing an oxidizing precursor into the reactor for a oxidizing precursor pulse time, the oxidizing precursor reacting with the first adsorbed entity; and purging the reactor of the co-reactant precursor.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

This summary is illustrative only and is not intended to be in any way limiting. Other aspects, inventive features, and advantages of the devices or processes described herein will

BRIEF DESCRIPTION OF THE FIGURES

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

Figure 1:
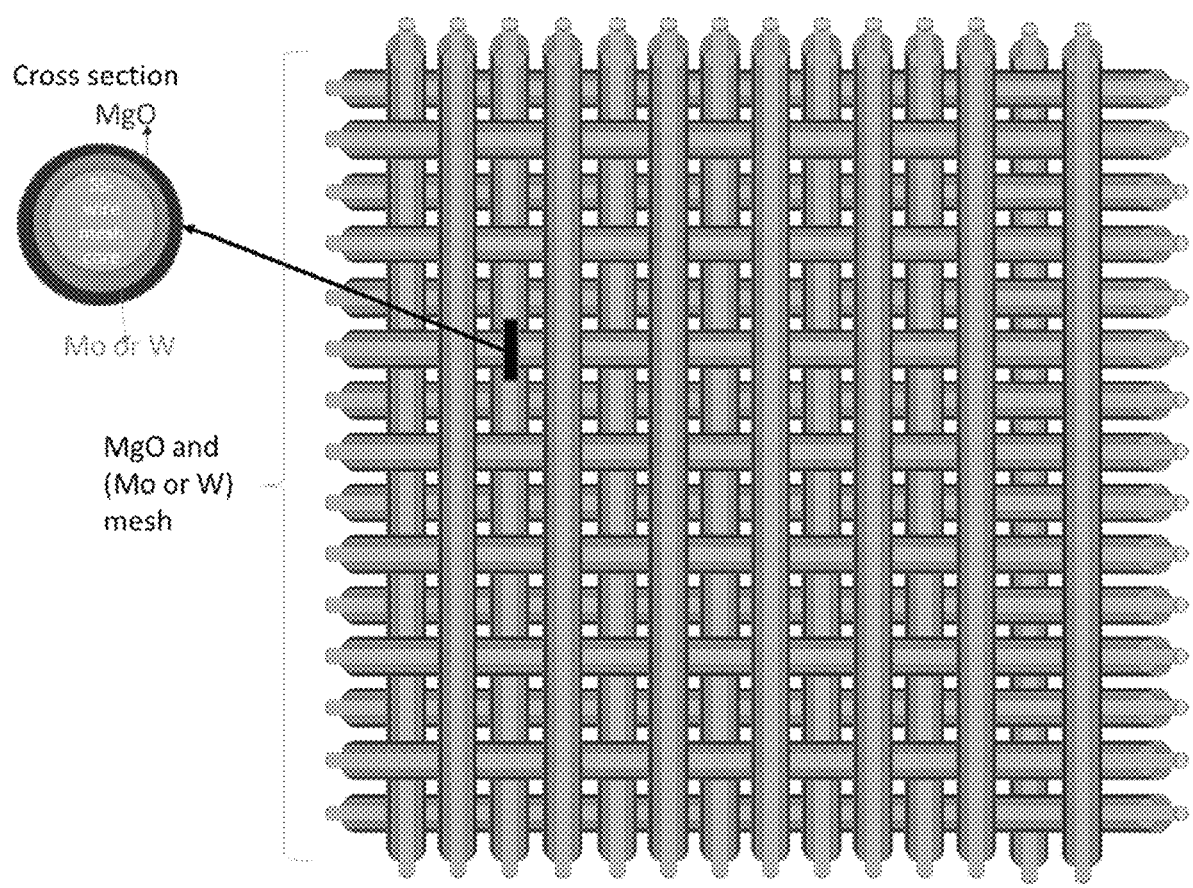
FIG. 1 is a schematic of an example MgO—(Mo or W) coated mesh.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Electron emission can enhanced by neutralization by an auger transition. Adapting this approach for TPCs can enhance the particles' detection sensitivity. In photodetectors, the photoelectrons are generated from a photocathode. Normally, the number of photoelectrons is limited by the quantum efficiency of the photocathode. In addition, most of the photodetector's first strike is not well defined. Even if well defined by additional physical means, the photoelectrons or ions may absorbed, which can reduce the efficiency. Adapting additional structure with high secondary emission yield (e.g., MgO) can define first strike of the signal. While various ion detection structures have been known, Lior Arazi's work proposed a new structure as a hypothetical cathode-side ion detection structure. The structure proposed includes a micro-strip gas counter-like structure ("MSGC"). See, ARAZI, "On the possibility of positive-ion detection in gaseous TPCs and its potential use for neutrinoless double beta decay searches in $^{136}Xe$," Journal of Physics: Conference Series 1029, 17 pages (2018). However, a process capable of producing such a structure has not been previously known.

Described herein is a method for creating structure for particle detection in time projection chambers and photodetectors, for example such as the structure proposed by Azazi. Described herein are processes that use ALD to produce structures that can be used directly in particle-detection applications where enhanced electron emission is desirable and can play a role in electrons emission. In one example described below, a large area active structure was fabricated as proof of concept using low cost stainless steel mesh with desire dimensions (10-100 µm) spacing with coating of Mo—MgO and W—MgO by ALD methods.

In one embodiment, ALD is utilized to deposit a coating of Mo—MgO and/or W—MgO on a substrate such as a mesh. FIG. 1 shows a schematic of a coated mesh, in the illustrated embodiment, coated with MgO and then coated with either Mo or W. The cross section of an individual fiber in the mesh shows the process coats the entire circumference of the fiber. In one embodiment, the fiber mesh can be coated in a thermal cross-flow or showerhead ALD reactor. For certain embodiments, it is important to have uniform coatings, where the active area of fiber substrate needs to be kept elevated so that ALD precursor exposure on every contour fiber surface will be equal in time and space.

In one embodiment, the mesh may be stainless steel. In one embodiment, the mesh has a wire diameter of 10-50 µm, such as 25 µm, and a spacing between wires of 20-100 µm. In some embodiments, the ALD process allows one to coat non-traditional materials (e.g., complex oxides, nanocomposites, metal alloy or multilayers, etc.) as far as there is enough open porosity/area for the ALD process to deposit a substrate of any complex size, shape, or geometry.

In its simplest form, ALD is a half-reaction or half-cycle, two-step process where, in a first half-cycle, a first precursor binds to the surface of a substrate (adsorption) and the first precursor is purged, and then, in a second half-cycle, a second precursor (or co-reactant) is added to react with the adsorbed/bound intermediate entity formed by the first precursor. The reaction of the second precursor with the first adsorbed entity forms a deposited material. Subsequent ALD cycles may deposit the same material or different material forming monolythic layers of desired thickness or mixed layers having tunable individual thicknesses and repeating patterns.

In one embodiment, illustrated in FIG. 1, the general ALD process is a super-cycle of a first ALD deposition and a second ALD deposition, each of which consist of a first half reaction and a second half reaction. The first ALD deposition cycle (e.g., a metal deposition, in one embodiment) includes a substrate that is reacted with a W precursor or a Mo precursor in the first half reaction to form a first intermediate entity having the respective W or Mo metal from the respective precursor. In a second half reaction, a first reducing precursor, such as a disilane ($Si_2H_6$) reducing agent, is exposed to the first intermediate entity and reacted to form a deposited metal (W or Mo) layer on the substrate.

In one embodiment, the second ALD deposition cycle is utilized to deposit a second material forming a topcoat (e.g., an oxide deposition, in one embodiment). The second deposition cycle comprises a second metal precursor, such as a magnesium (Mg) precursor, that is reacted with the deposited metal layer, such as Mo or W, to form a second intermediate entity having the respective Mg from the respective precursor. In a second half reaction of the second ALD deposition, an oxidizing precursor, such as a water, is exposed to the second intermediate entity and reacted to form a deposited metal (W or Mo) layer on the substrate. In some embodiments, the top coat via the second ALD deposition may comprise a oxide, sulfide, nitride or combination thereof that exhibit a high secondary electron emission ("SEE") coefficient.

The ALD occurs with a substrate serving as the initial deposition surface. The substrate may be an aluminum compound. In one embodiment, the substrate for the processes described herein may be stainless steel (e.g., 20-100 μm grind stainless steel, which may be in sheet form). A typical reactor can utilize a 12 in×12 in sheet, though other sizes of substrate may be utilized.

The mesh substrate can be adjusted based on the TPC volume. For example, typical commercial TPCs can use a 1 in square to several meters square. Further, it should be appreciated that as these are wire fabrics or cloth, one can easily make a roll of larger substrate and coat this in cost effective manner in tubular ALD cross-flow reactor or roll-to-roll ALD reactor.

The ALD process includes the first ALD deposition with a first metal precursor. Alternative embodiments may use a precursor selected from tungsten hexafluoride ($WF_6$), molybdenum hexafluoride ($MoF_6$) molybdenum(V) chloride, tunsten(V) chloride, (bicyclo[2.2.1]hepta-2,5-diene) tetracarbonylmolybdenum(0) bis(cyclopentadienyl)molybdenum(IV) dichloride, tungsten diazabutadiene, molebdenum diazabutadiene, Molybdenum(VI) Dioxide bis (2,2,6,6-tetramethyl-3,5-heptanedionate) Molybdenumhexacarbonyl, Cyclopentadienylmolybdenum(II) tricarbonyl, Bis(tert-butylimino)bis(tert-butylamino)tungsten, Tungsten hexacarbonyl, Tetracarbonyl(1,5-cyclooctadiene)tungsten (0), Bis(isopropylcyclopentadienyl)tungsten(IV) dihydride, Bis(t-butylimido)bis(dimethylamino)molybdenum(VI), Bis (ethylbenzene)molybdenum, Cycloheptatriene molybdenum tricarbonyl.

In one embodiment, the first metal precursor comprises Mo, such as $MoF_6$. In one embodiment, the first metal precursor comprises W, such as $WF_6$. The ALD process further includes the first ALD deposition with a reducing precursor. Alternative embodiments may use a reducing agent selected from $SiH_4$, $H_2$, $NH_3$, $Si_2H_6$, hydrazine, trimethylamine ("TMA"), $B_2H_6$ as one of the reducing precursor for metallic Mo and W deposition. In one embodiment, the reducing precursor is $Si_2H_6$. A $Si_2H_6$ reducing agent may be used with either/both the Mo precursor and/or the W precursor. In one embodiment, each ALD deposition consists of a metal deposition cycle, which may be repeated to form a super-cycle, with a first metal precursor vapor pulse, such as $MoF_6$ or $WF_6$ (e.g., for 2 seconds), for a first precursor exposure (e.g., for 2 seconds); followed by a first metal precursor purge (e.g., for 10 seconds), such as where the reactor is pumped to a vacuum; followed by a first reducing precursor pulse, such as $Si_2H_6$ (e.g., for 2 seconds), with a reducing precursor exposure (e.g., for 2 seconds); followed by a reducing precursor purge (e.g., for 10 seconds). It should be appreciated that precursor dose and purge time is based on the self-limiting behavior of the precursors. This can be varied in wide range from a few milliseconds to tens of seconds. Further, if a longer dose then purge time is utilized, the times may need to increase to avoid a CVD type reaction, which can results in non-uniformity and particles formation.

In some embodiments, the pre-ALD starting mesh, has low surface area the initial ALD cycles may use relatively shorter precursor doses. can use short time of precursor doses. This timing can also adjusted as per vapor pressure of $WF_6$ and $MoF_6$. Also both W and Mo deposition show strong temperature dependence, such as lower temperature low growth rate and higher temperature higher growth rate. In one embodiment, the ALD reaction occurs in a process temperature window in the range of 100-400° C.

In one embodiment, each ALD deposition consists of a cycle, which may be repeated to form a super-cycle, with a Mg precursor vapor pulse, such as magnesocene ($Mg(Cp)_2$) (e.g., for 2 seconds), for a Mg precursor exposure (e.g., for 2 seconds); followed by a Mg precursor purge (e.g., for 10 seconds), such as where the reactor is pumped to a vacuum; followed by a first oxidizing precursor pulse, such as water (e.g., for 2 seconds), with a oxidizing precursor exposure (e.g., for 2 seconds); followed by a second co-reactant precursor purge (e.g., for 10 seconds). It should be appreciated that precursor dose and purge time is based on the self-limiting behavior of the precursors. This can be varied in wide range from a few milliseconds to tens of seconds. Further, if a longer dose then purge time is utilized, the times may need to increase to avoid a CVD type reaction, which can results in non-uniformity and particles formation.

In one embodiment, MgO can be deposited via using many magnesium precursors, such as: alkyl derivatives, such as magnesocene ($Mg(Cp)_2$), $Mg(C_5H_5)_2$, $Mg(C_5H_4Me)_2$, $Mg(C_5H_4Et)_2$, as well as octamethyl magnesum-dialuminum ($MgAl_2(CH_3)_8$), and magnesium borohydride ($Mg(BH_4)_2$); ketoimiato, such as bis(ketoiminato)magnesium(II) complexes of composition [$Mg(OCR^2CH_2CHR^1NCH_2CH_2X)_2$] ($X=NMe_2$: $R^1=R^2=Me$; $R^1=Me$, $R^2=Ph$. $X=OMe$; $R^1=R^2=Me$); beta diketonate, such as $[MgMe(OtBu)]_4$, $Mg(dmto)_2$, $Mg(tmhd)_2(tmeda)$, $[Mg(tmhd)_2]_2$, and $Mg(acac)_2$.

Dose time can be varies based on vapor pressure of the precursor and growth temperature can be adjusted as per precursor sublimation temperature. An oxidizing precursor may be selected for reactivity with the second metal precursor, such as water, ozone, and hydrogen peroxide. It should be appreciated that more complicated ALD schemes can be constructed as a super-cycle comprising various sub-cycles for depositing a material as described or for depositing multiple different materials for multiple dopants or formation of bi-metallic (tri-metallic, etc.) materials, such as varying the parameters for any of the individual steps within a cycle. In one embodiment, the deposition may be a doped layer or a mixed metal composite. In one embodiment, the metallic (Mo or W) layer can be doped. For example, both Mo and W show AN alloy or multiple layers of W and Mo can be use as one of the layer in fiber/mesh/cloth coating. In addition, MgO itself is a high SEE coefficient layer; the SEE properties can be further improve by adding or doping $TiO_2$ or $MgF_2$.

The respective pulse and exposures may be the same time or pulse may be for a shorter time than the overall exposure. In some embodiments, the first precursor is a vapor and the first precursor pulse comprises input to the reactor of a first precursor vapor for a first metal precursor pulse time of a few milliseconds to tens of seconds (e.g., 0.5, 1, 5, 10, 20, or 30 seconds, inclusive of all ranges and values therebetween), such as 2 seconds. The first partial pressure of the first precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr, such as 0.1-10 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is what dictates the diffusion boundary conditions. A carrier gas, such as nitrogen or other non-reactive (with the substrate or the precursors) gas, may be used. Overall ALD reaction can be carried out from $10^{-2}$-1000 Torr.

In some embodiments, the first precursor exposure comprises exposing the substrate to the first precursor for a first exposure time and a first partial pressure of the first metal precursor so that the first precursor binds with the substrate or coating from prior ALD cycles on the substrate. In some embodiments, given the short time for the pulse/exposure for this ALD process the pulse lasts the entire exposure until the purge starts with the pulse time and exposure time being the same. The first metal precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1-10 seconds (e.g., about 2 seconds). The first partial pressure of the first metal precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the first metal precursor is in the range of 0.05-1 Torr (e.g., about 0.5 Torr). A longer dose is needed for high surface area powder/catalysis coatings.

The first precursor purge evacuates unreacted precursor from the reactor. The first precursor purge may be for a first precursor purge time of 0.5-30 seconds (e.g., 0.5, 1, 5, 10, 20, or 30 seconds, inclusive of all ranges and values therebetween), such as 10 seconds. The first precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

In some embodiments, the base material can be heated to a predetermined temperature during the ALD process. For example, the first predetermined temperature can be in the range of 50-200° C. (e.g., 50, 60, 70, 80, 90, 100, 110, 120, 130, 140, 150, 160, 170, 180, 190 or 200° C., inclusive of all ranges and values therebetween). In some embodiments, the first predetermined temperature is in the range of 100-300° C. (e.g., 200° C.). Temperature also impacts the overall energy in the system and the performance for diffusion and/or reaction. In an ALD process, the deposition temperature range where more or less same growth as function of growth occurs is referred to as the "ALD window." The ALD reaction should occur at a temperature of the of the precursor sufficient to give constant precursors evaporation rate (i.e., vapor pressure). If vapor pressure is not enough, there may still be layer growth but the surface coverage will be poor. If vapor pressure is too much, it will waste precursor and there may be CVD growth if there is not sufficient purge time due to mixing of precursors. The temperature of the layer growth can be as low as subliming temperature of the ALD precursors. For example, if a precursor sublimes at 150° C. films, can also grow around that temperature. Generally, however, layer growth temperature is 25-50° C. higher than precursor sublimation temperature.

The substrate, after reaction with the first metal precursor, is then exposed to a second precursor by a second precursor pulse introducing the second precursor to the reactor and then exposing for the second precursor exposure such that the second precursor reacts with the first metal precursor or, more particularly, with intermediate entity formed by the first metal precursor and the substrate (or ALD coating on the substrate).

In some embodiments, the second precursor pulse comprises input to the reactor of the second precursor vapor for a second precursor pulse time of 0.5-30 seconds (e.g., 0.5, 1, 5, 10, 20, or 30 seconds, inclusive of all ranges and values therebetween), such as 2 second. The first partial pressure of the second precursor pulse can be in the range of 0.01-10 Torr (e.g., 0.01, 0.05, 0.1, 0.5, 1.0, 5.0, or 10 Torr, inclusive of all ranges and values therebetween) such as 0.5 Torr.

In some embodiments, exposing the electrode to second precursor for a second precursor exposure time and a second partial pressure of the second precursor so that second precursor reacts with the entity formed by the first metal precursor reacting with the substrate (or previous ALD deposited coatings). The second precursor exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 2 second. The second partial pressure of the second precursor can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the second precursor is in the range of 0.1-1 Torr (e.g., about 0.5 Torr) such as 0.5 Torr.

The second precursor purge evacuates unreacted precursor from the reactor. The second precursor purge may be for a second precursor purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The second precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum. In some embodiments, the second precursor may include one or more $Si_2H_6$, such as in combination with $H_2$ and $B_2H_6$.

Any number of cycles of the first ALD deposition exposing the base material to the first metal precursor and the reducing precursor can be performed to reach a thickness of coating or to provide a desired alteration of the substrate properties and likewise for the number of cycles of the second ALD deposition forming a top coat. In some embodiments, the number of cycles of the ALD process can be in the range of 1-50 (e.g., 1 cycle, 2, 3, 4, 5, 10, 15, 20, 25, 30, 35, 40, 45, or 50 cycles, inclusive of all ranges and values therebetween). In one embodiment, the thickness rage for W or Mo is 5 nm to 1 micron. In one embodiment, the thickness range for MgO is 1-100 nm.

In one embodiment, one or more of the W or Mo deposition cycle or the MgO deposition cycle may be prefaced by the deposition of a nucleation or seed layer. In one embodiment, one or more layers of materials, such as a dopant for electron emissions, may be deposited between the W or Mo layer and the MgO layer.

In some embodiments, growth temperature is important for controlling the microstructure. For example, if mesh is made with polymer (such as polyamide) then temperature range can be 100-200° C. (defined by melting point of polymer and hence fiber. For embodiments where the mesh is made of metal fiber then deposition temperature range can be 100-400° C. Both microstructure (grain size) and crystallinity (crystallographic orientation of the grains) can be tune via ALD growth temperature and the type of reducing precursor used.

Experimental Examples—Mesh Testing

Tests were done to determine if a metal mesh used as an electrode in a simple field cage could produce an enhanced ion drift current when coated with Mo—MgO by ALD. A simple 5 cm×5 cm×5 cm field cage was used in which 3 electrodes formed by aluminum bars produced a field of >400V/cm. This device is placed into a 1.5 L spherical volume which can hold gas pressures of up to 5 atmospheres. The background current was measured at 0.000 nA and when a caesium (Cs)-137 gamma ray source (662 keVgammas) was added, the current jumped to 0.006 nA.

Figure 4C:
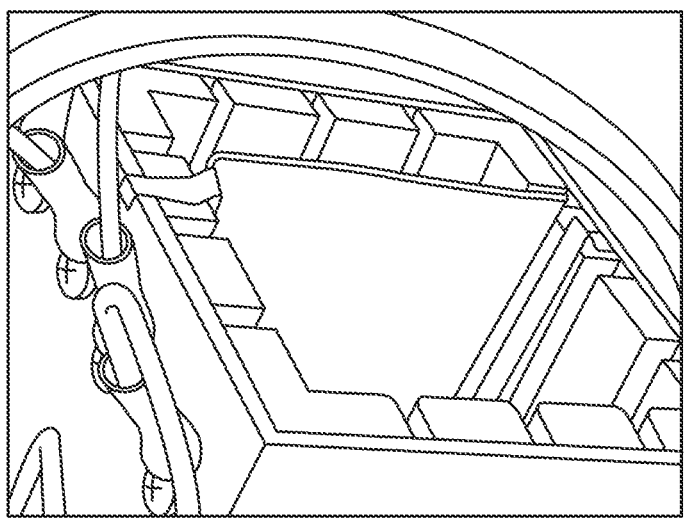
FIGS. 4A-4C show an experimental setup.
Figure 4B:
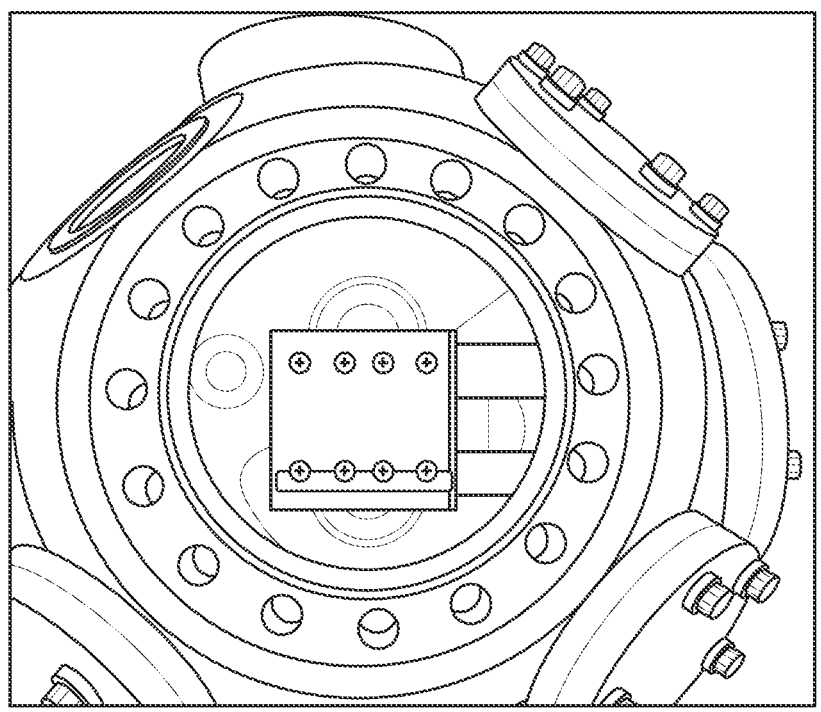
Figure 4A:
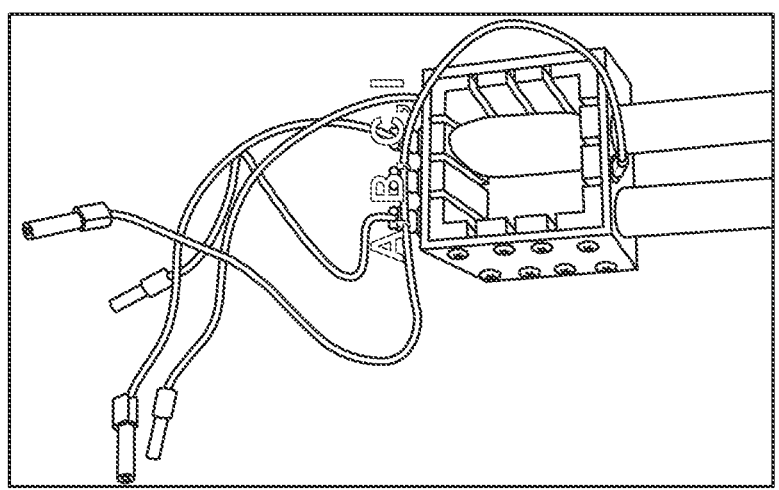
Figure 5A:
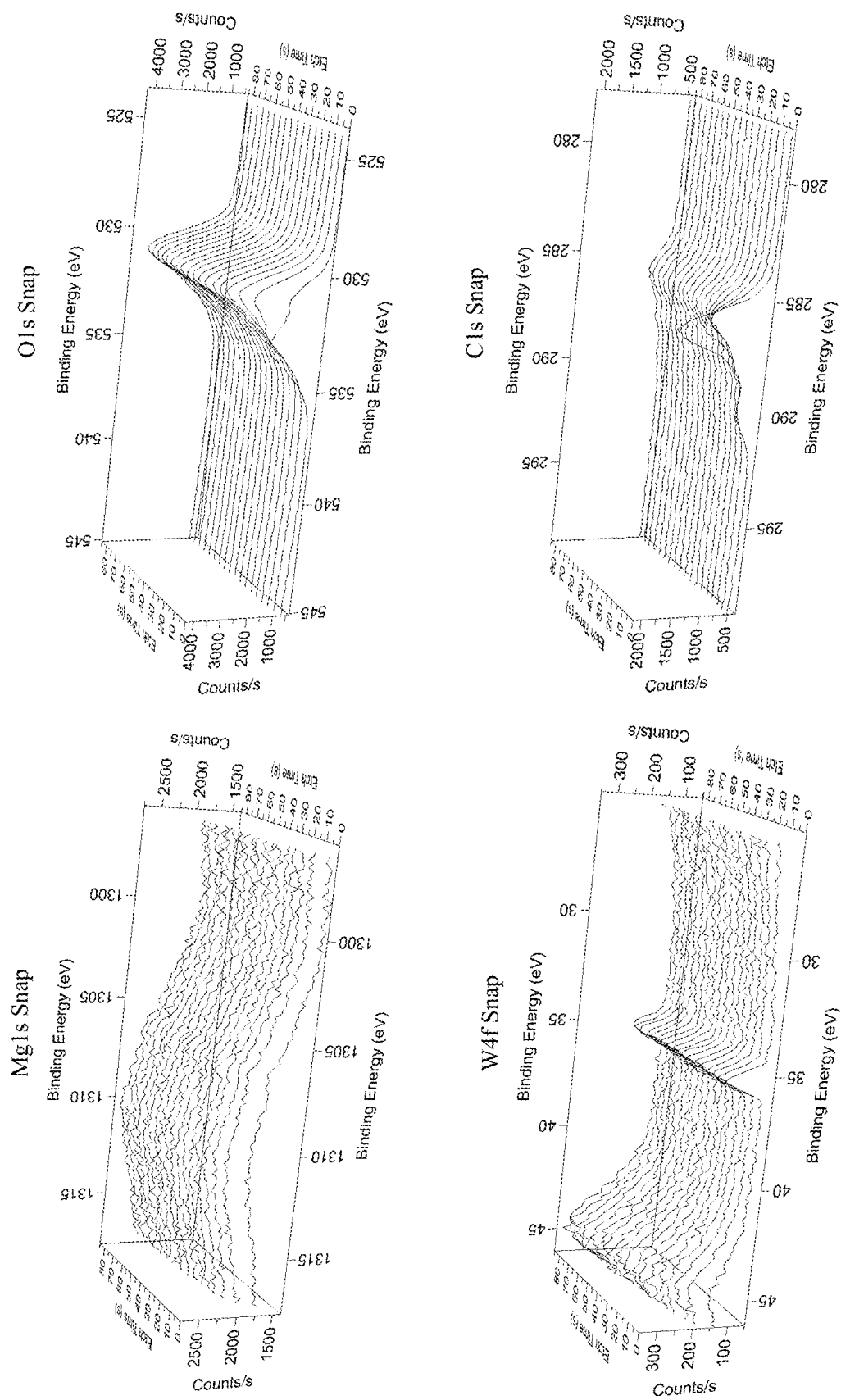
FIGS. 5A-5C show XPS depth profile analyses for bare mesh (FIG. 5A), W coated mesh (FIG. 5B), and MgO/W coated mesh (FIG. 5C).
Figure 5B:
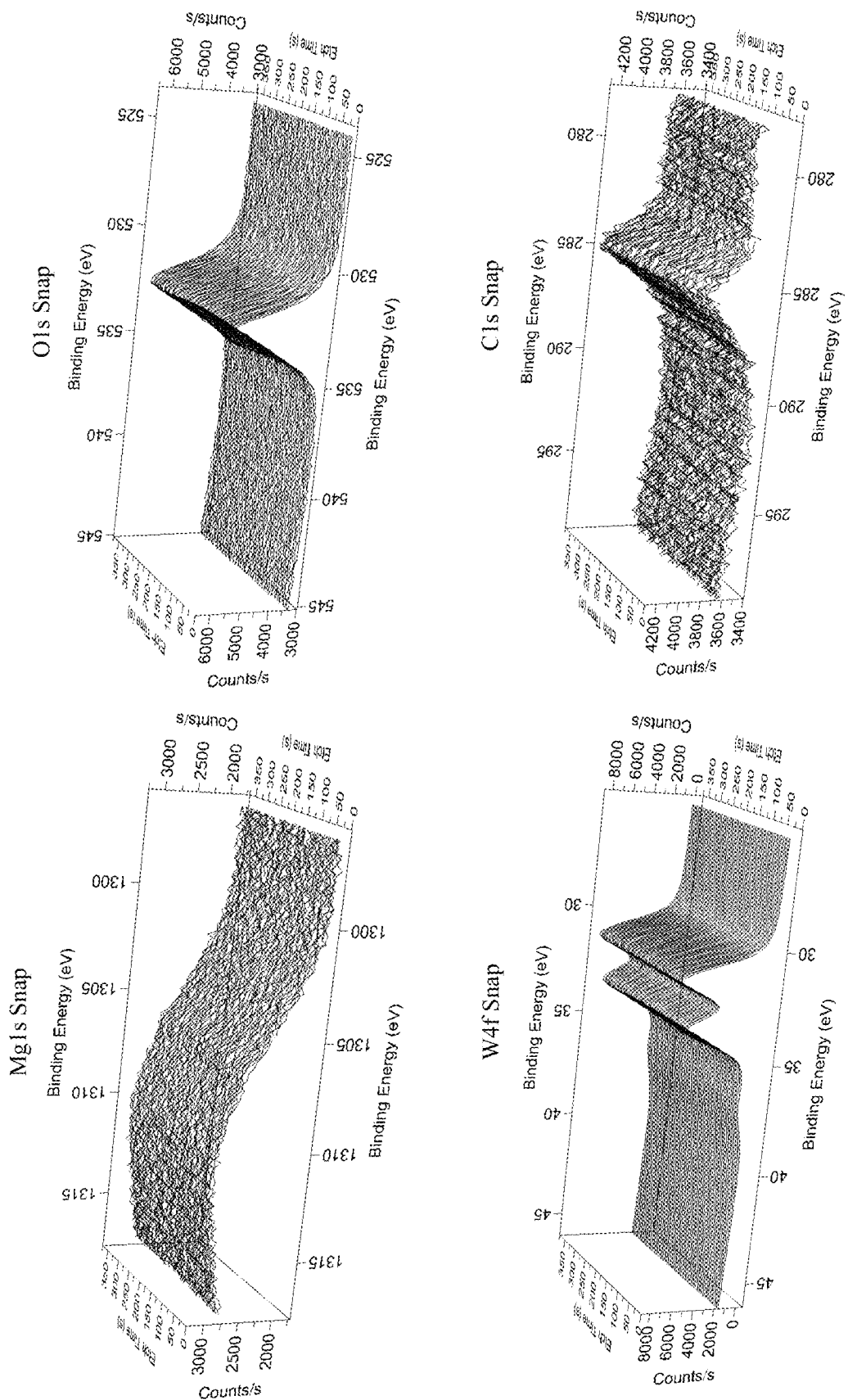
Figure 5C:
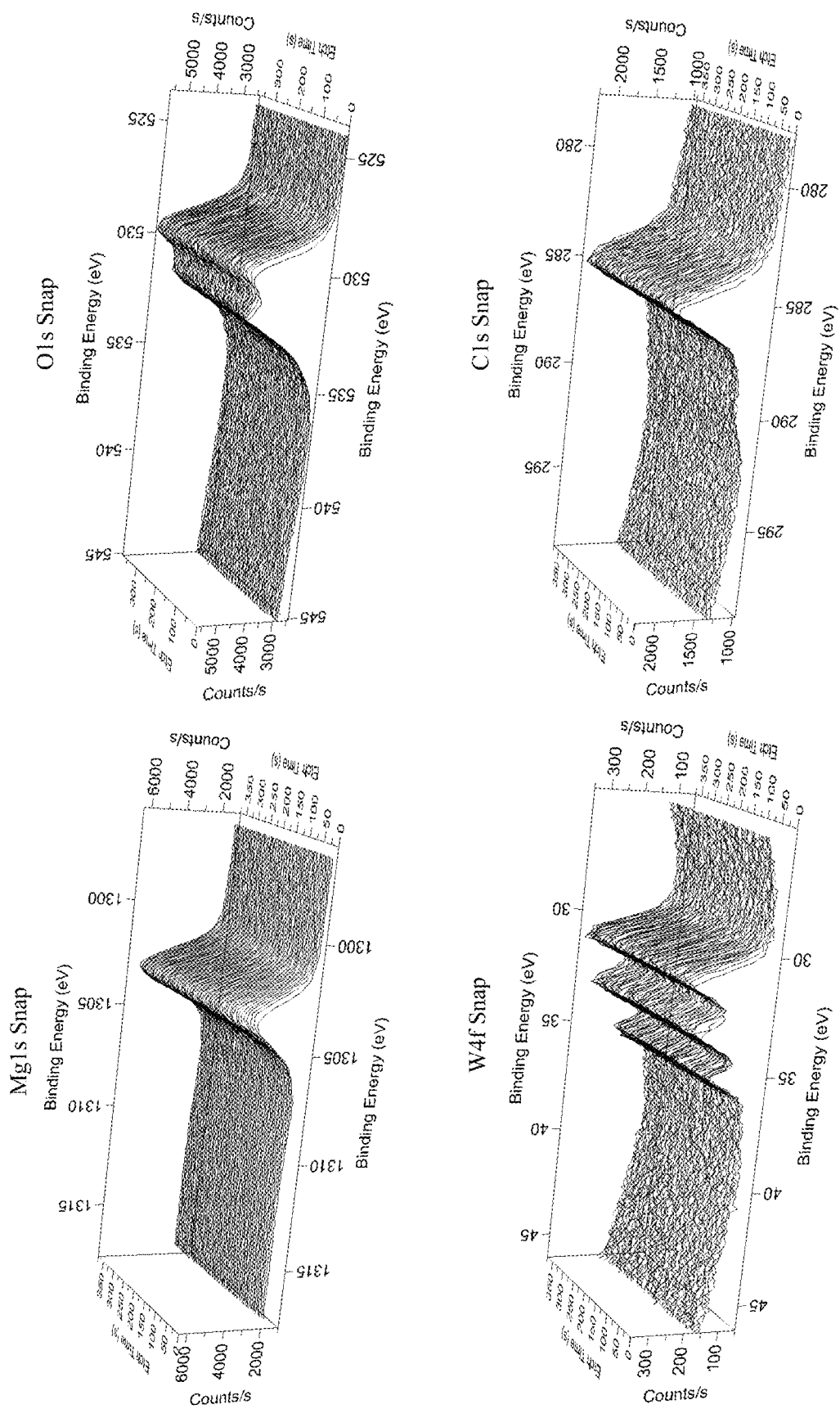
Figure 6A:
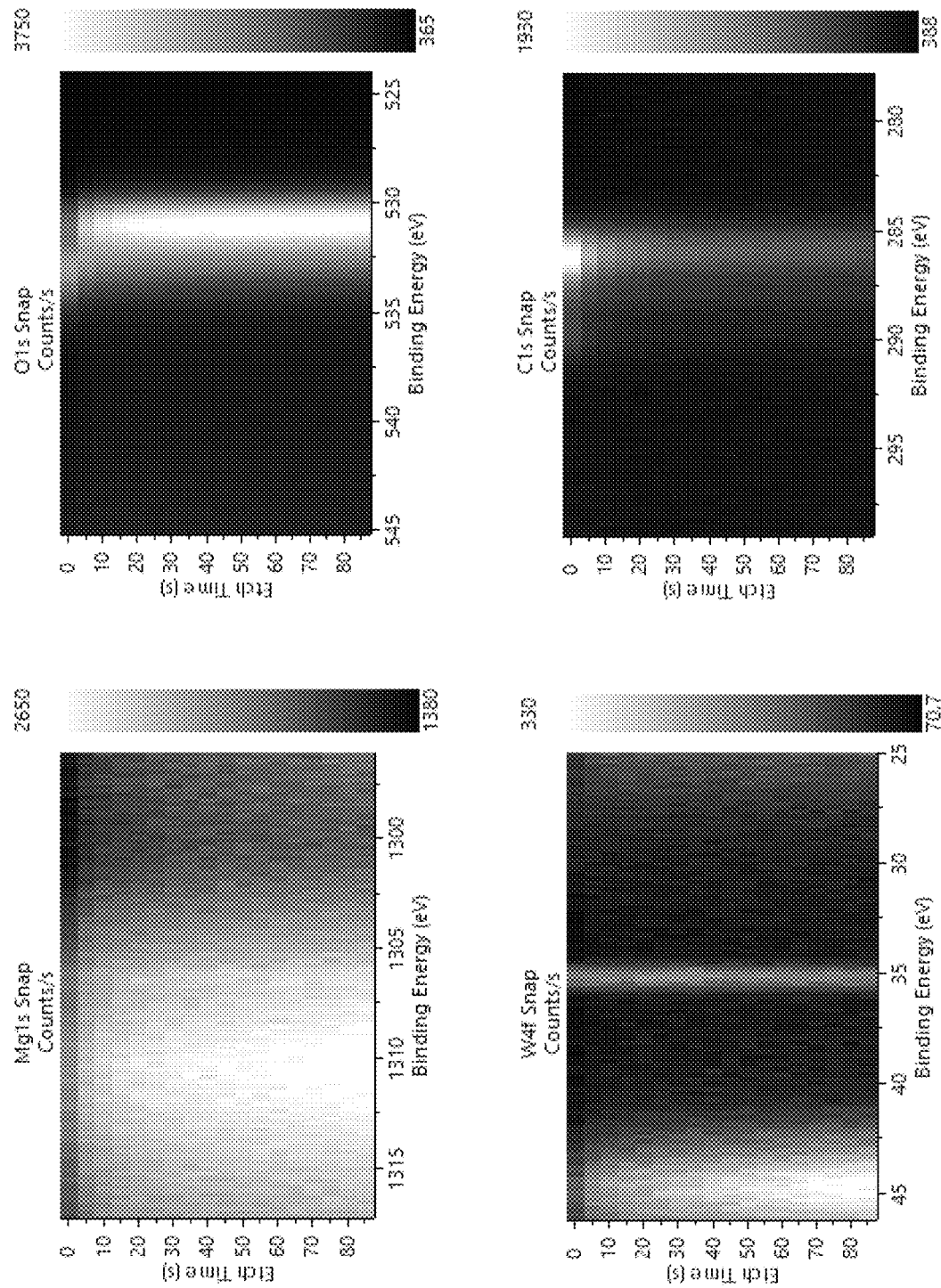
FIGS. 6A-6C show images for XPS depth profile analyses for bare mesh (FIG. 6A), W coated mesh (FIG. 6B), and MgO/W coated mesh (FIG. 6C).
Figure 6B:
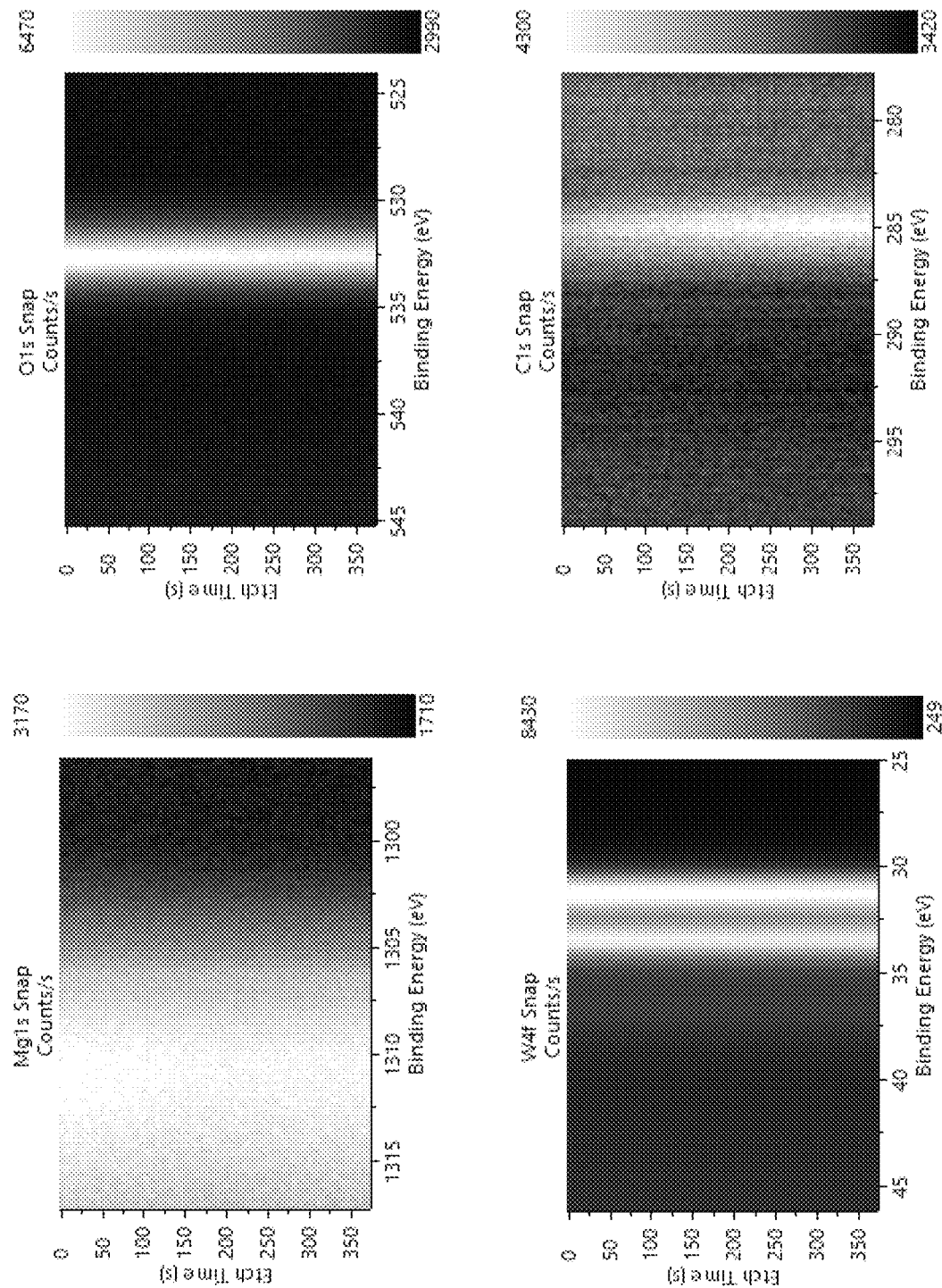
Figure 6C:
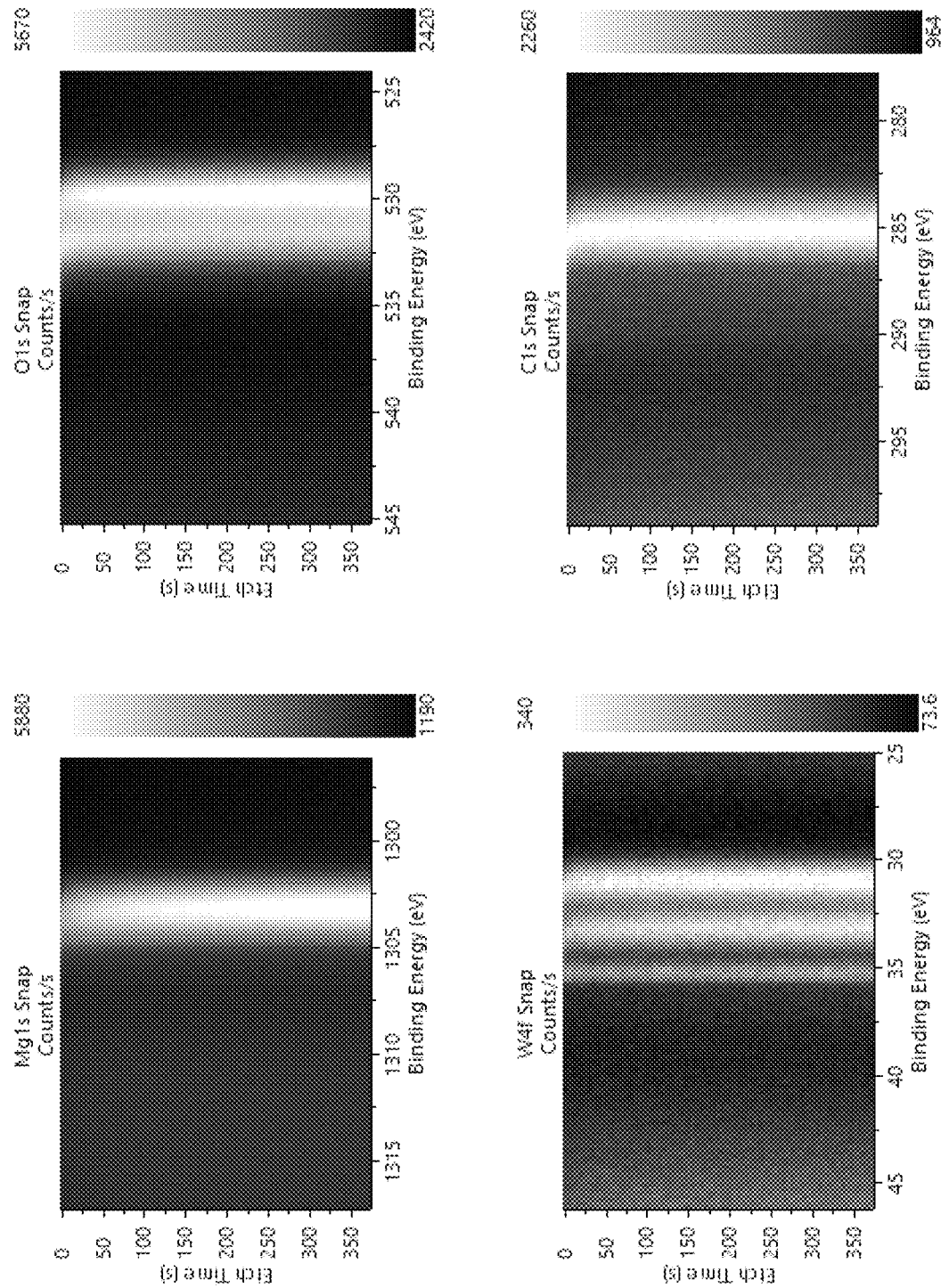

High-voltage settings were ramped up to +2000V on the first electrode (A), +1330V on the second electrode (B), +660V on the wire mesh (C), and 0 V on the last (readout) electrode (I), as shown in FIG. 4A.

Figure 2A:
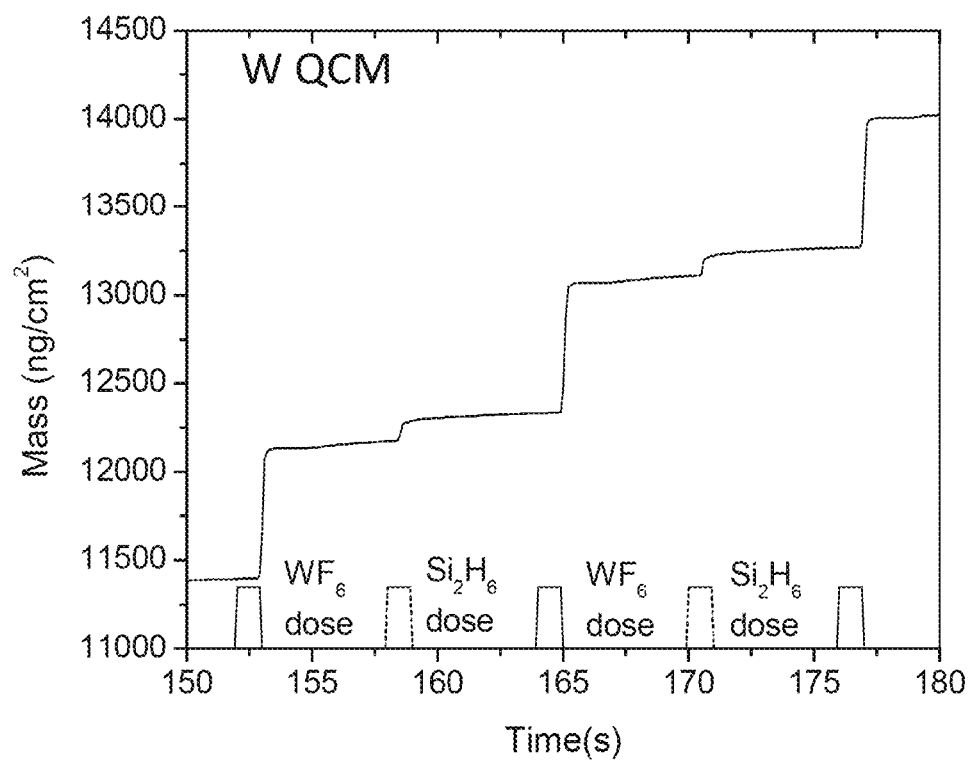
FIGS. 2A-2B show quartz crystal microbalance ("QCM") data for W (FIG. 2A) and Mo (FIG. 2B) samples.
Figure 2B:
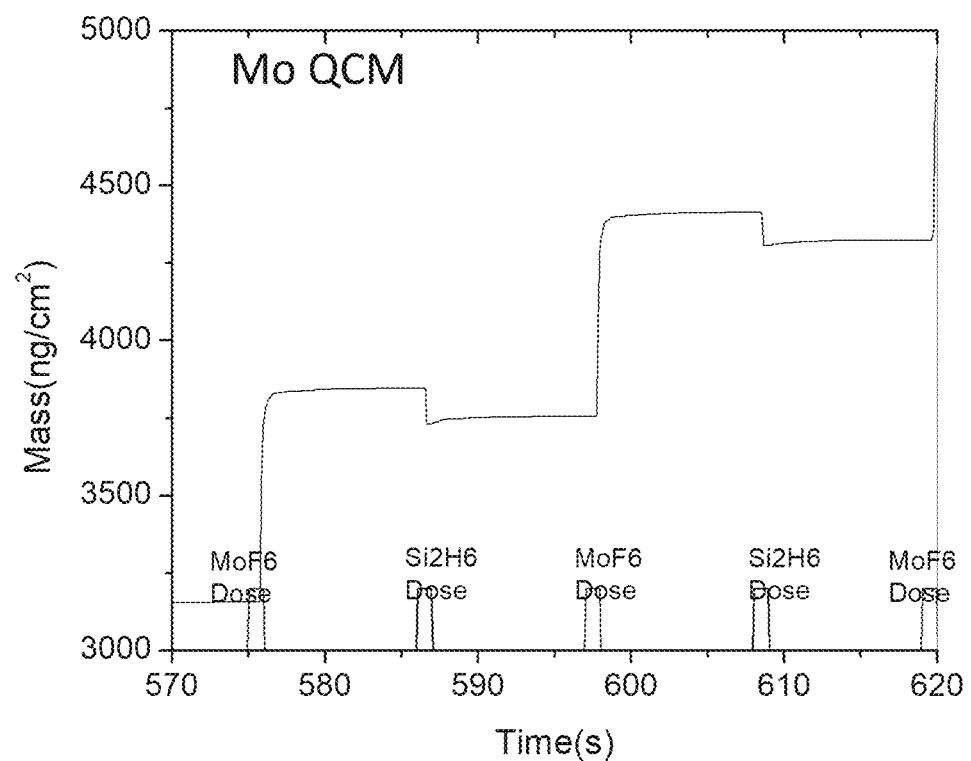
Figure 2C:
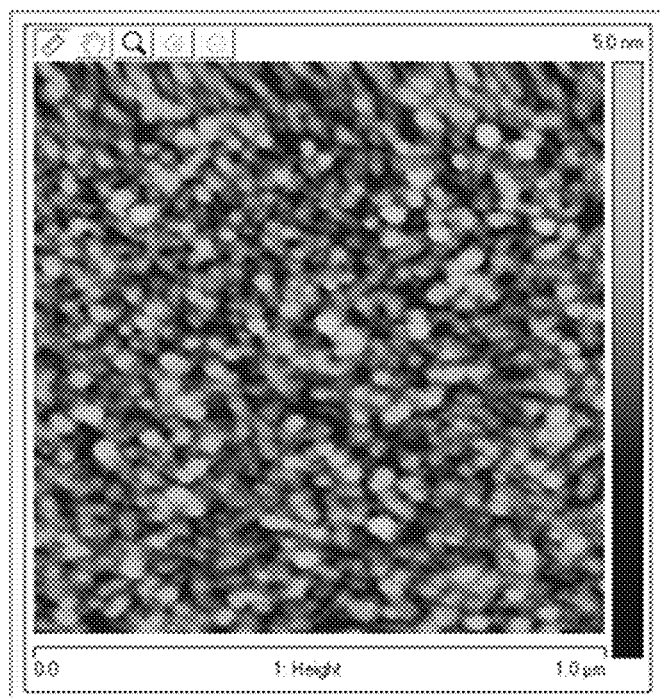
FIGS. 2C-2D show surface microstructure by atomic force microscopy for W on aluminum oxide ($Al_2O_3$)//Si (FIG. 2C) and M on $Al_2O_3$//Si (FIG. 2D).
Figure 2D:
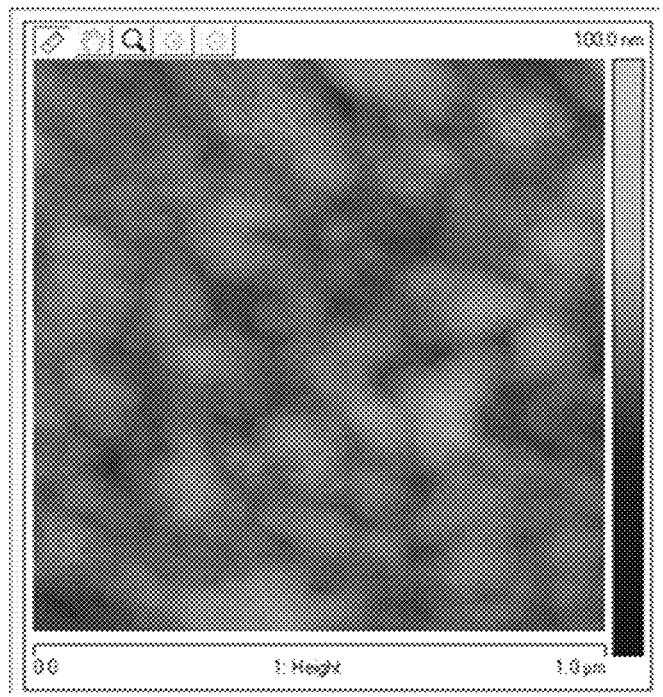

FIGS. 2A-2B show QCM results. FIG. 2A shows the results for W, and FIG. 2B shows the results for Mo. FIGS. 2C-2D show films grown at 200° C. on reference Si. The thickness is 50 nm for W and 100 nm for Mo, W shows fine nanocrystalline surface whereas Mo layer has high grain growth and slightly high roughness. FIG. 2C shows the results for W on aluminum oxide ($Al_2O_3$)//Si, and FIG. 2D shows the results for M on $Al_2O_3$//Si.

Figure 3:
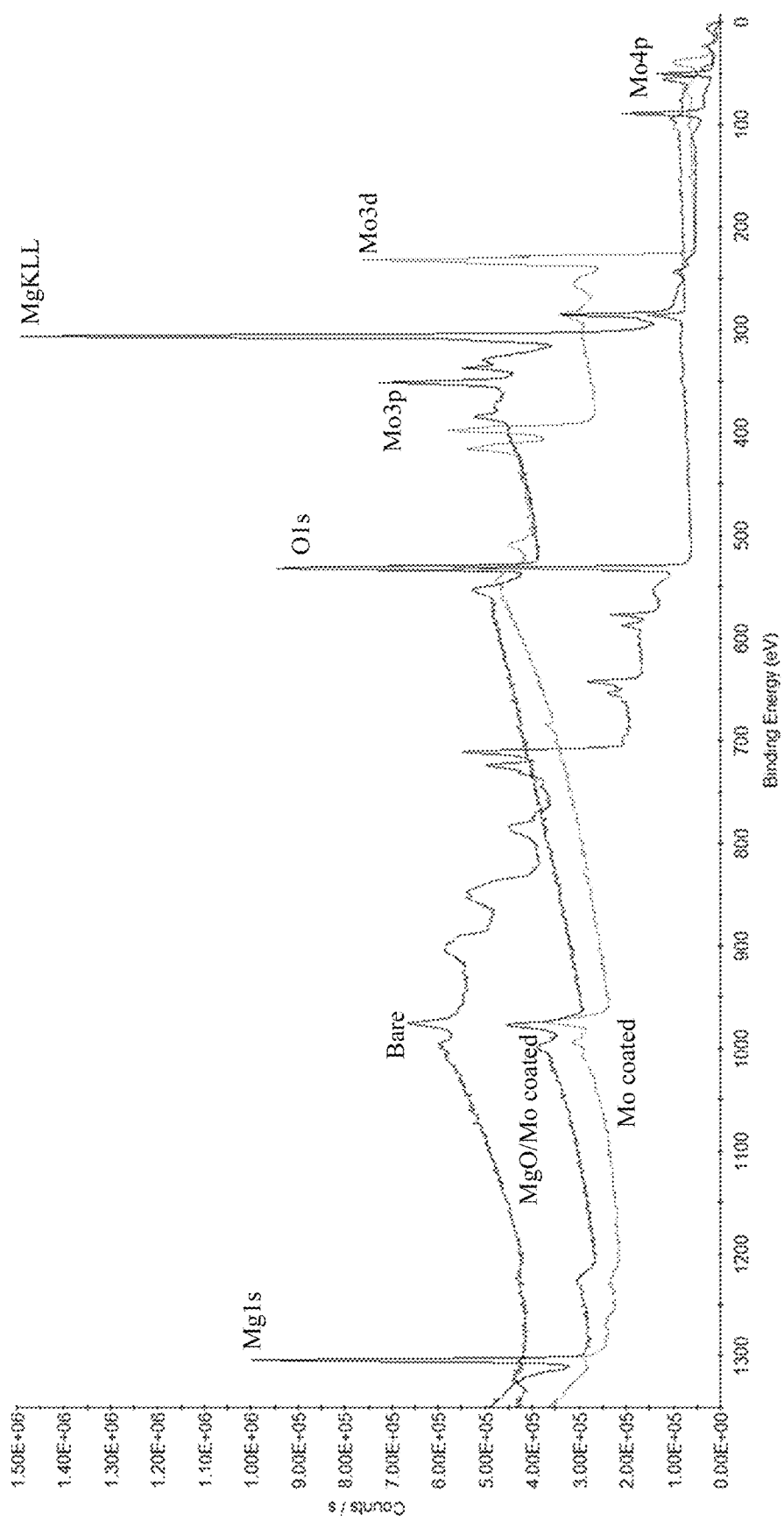
FIG. 3 is a graph of x-ray photoelectron spectroscopy ("XPS") data for one embodiment of a coated mesh.

FIG. 3 shows the XPS analysis of a coated mesh sample. For the evaluated samples, the grids were coated at 200° C. for the first deposition of Mo with 100 cycle $MoiF_6$—$Si2H_6$ (10 nm) carried out and without breaking vacuum a second deposition of MgO with 60 cycles of $Mg(Cp)2$-$H_2O$ (10 nm) carried out.

Experimental testing was done on embodiments made in accordance with the above processes. Tests were conducted to determine if a metal mesh used as an electrode in a simple field cage could produce an enhanced ion drift current when coated with Mo—MgO by ALD. A simple 5 cm×5 cm×5 cm field cage was used in which 3 electrodes formed by aluminum bars produced a field of >400 V/cm.

This cage was placed into a 1.5 liter spherical volume which can hold gas pressures of up to 5 atmospheres. The background current was measured at 0.000 nA, and when a Cs-137 gamma ray source (662 keVgammas) was added, the current jumped to 0.006 nA. High-voltage settings were ramped up to +2000 V on the first electrode (A), +1330 V on the second electrode (B), +660 V on the wire mesh (C), and 0 V on the last (readout) electrode (I), as shown in FIG. 4A. Table 1 below shows data collected in tests of coated mesh (xenon and argon were used for TPCs for different light emission).

TABLE 1

| Pressure (Ar) (psi) | Pressure (Xe) (psi) | Wire Mesh | Cs-137 Source | Current (nA) |
|---|---|---|---|---|
| 20 | 0 | Empty chamber | — | 0.000 |
| 20 | 0 | Empty chamber | Yes | 0.006 |
| 20 | 0 | Bare | — | 0.000 |
| 20 | 0 | Bare | Yes | 0.005 |
| 20 | 10 | Bare | — | 0.000 |
| 20 | 10 | Bare | Yes | 0.011 |
| 20 | 10 | Mo—MgO | — | 0.000 |
| 20 | 10 | Mo—MgO | Yes | 0.022 |

TABLE 1-continued

| Pressure (Ar) (psi) | Pressure (Xe) (psi) | Wire Mesh | Cs-137 Source | Current (nA) |
|---|---|---|---|---|
| 20 | 20 | Mo—MgO | — | 0.000 |
| 20 | 20 | Mo—MgO | Yes | 0.030 |
| 0 | 20 | Mo—MgO | — | 0.001 |
| 0 | 20 | Mo—MgO | Yes | 0.029 |

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of forming a secondary electron emissive coating comprising:
providing a wire mesh substrate within an atomic layer deposition reactor; and
depositing a coating of Mo or W by an atomic layer deposition process including at least one cycle of:
pulsing a first metal precursor selected from the group consisting of molybdenum(V) chloride, tunsten(V) chloride, (bicyclo[2.2.1]hepta-2,5-diene)tetracarbonylmolybdenum(0) bis(cyclopentadienyl)molybdenum(IV) dichloride, tungsten diazabutadiene, molebdenum diazabutadiene, Molybdenum(VI) Dioxide bis(2,2,6,6-tetramethyl-3,5-heptanedionate) Molybdenumhexacarbonyl, Cyclopentadienylmolybdenum(II) tricarbonyl, Bis(tert-butylimino)bis(tert-butylamino)tungsten, Tungsten hexacarbonyl, Tetracarbonyl(1,5-cyclooctadiene)tungsten(0), Bis(isopropylcyclopentadienyl)tungsten(IV) dihydride, Bis(t-butylimido)bis(dimethylamino)molybdenum (VI), Bis(ethylbenzene)molybdenum, Cycloheptatriene molybdenum tricarbonyl a W or Mo precursor into the reactor for a first metal precursor pulse time, forming a first adsorbed entity on the substrate;
purging the reactor of the first metal precursor;
pulsing a first reducing precursor selected from the group consisting of $SiH_4$, $H_2$, $NH_3$, $Si_2H_6$, hydrazine, TMA, $B_2H_6$ into the reactor for a second precursor pulse time, the second precursor reacting with the first adsorbed entity; and
purging the reactor of the co-reactant precursor.

2. The method of claim 1, wherein the wire mesh substrate is stainless steel.

3. The method of claim 1, wherein the wire mesh substrate comprises wires having a spacing therebetween of 20-100 microns.

4. The method of claim 3, the wire mesh has a wire diameter of 10-50 microns.

5. The method of claim 1, further comprising:
after the first ALD deposition, depositing a topcoat by a second ALD deposition including at least one cycle of:
pulsing a second metal precursor comprising a magnesium ALD precursor for a second metal precursor pulse time, forming a second adsorbed entity on the W or Mo coating;
purging the reactor of the second metal precursor;
pulsing an oxidizing precursor into the reactor for a oxidizing precursor pulse time, the oxidizing precursor reacting with the first adsorbed entity; and
purging the reactor of the co-reactant precursor.

6. The method of claim 5, wherein depositing the W or Mo coating has a thickness of about 5-1000 nm.

7. The method of claim 5, wherein depositing the top coat comprises a thickness of at least 1-100 nm.

8. The method of claim 5, wherein the second metal precursor is selected from the group consisting of magnesocene $(Mg(Cp)_2)$, $Mg(C_5H_5)_2$, $Mg(C_5H_4Me)_2$, $Mg(C_5H_4Et)_2$, octamethyl magnesum-dialuminum $(MgAl_2(CH_3)_8)$, magnesium borohydride $(Mg(BH_4)_2)$, bis(ketoiminato)magnesium(II) complexes of composition [Mg$(OCR^2CH_2CHR^1NCH_2CH_2X)_2$] (X=$NMe_2$: $R^1$=$R^2$=Me; $R^1$=Me, $R^2$=Ph. X=OMe; $R^1$=$R^2$=Me), $[MgMe(OtBu)]_4$, $Mg(dmto)_2$, $Mg(tmhd)_2(tmeda)$, $[Mg(tmhd)_2]_2$, and $Mg(acac)_2$.

9. The method of claim 5, further comprising a third ALD deposition depositing a dopant consisting of TiO2 or MgF2 in the topcoat.

10. A method of forming a secondary electron emissive coating comprising:
providing a wire mesh substrate within an atomic layer deposition reactor; and
depositing a coating of Mo or W by an atomic layer deposition process including at least one cycle of:
pulsing a first metal precursor selected from the group consisting of molybdenum(V) chloride, tunsten(V) chloride, (bicyclo[2.2.1]hepta-2,5-diene)tetracarbonylmolybdenum(0) bis(cyclopentadienyl)molybdenum(IV) dichloride, tungsten diazabutadiene, molebdenum diazabutadiene, Molybdenum(VI) Dioxide bis(2,2,6,6-tetramethyl-3,5-heptanedionate) Molybdenumhexacarbonyl, Cyclopentadienylmolybdenum(II) tricarbonyl, Bis(tert-butylimino)bis(tert-butylamino)tungsten, Tungsten hexacarbonyl, Tetracarbonyl(1,5-cyclooctadiene)tungsten(0), Bis(isopropylcyclopentadienyl)tungsten(IV) dihydride, Bis(t-butylimido)bis(dimethylamino)molybdenum (VI), Bis(ethylbenzene)molybdenum, Cycloheptatriene molybdenum tricarbonyl a W or Mo precursor into the reactor for a first metal precursor pulse time, forming a first adsorbed entity on the substrate;
purging the reactor of the first metal precursor;
pulsing a first reducing precursor selected from the group consisting of $SiH_4$, Hz, $NH_3$, $Si_2H_6$, Hydrazine, TMA, $B_2H_6$ into the reactor for a second precursor pulse time, the second precursor reacting with the first adsorbed entity; and
purging the reactor of the co-reactant precursor; and
depositing a topcoat by a second ALD deposition including at least one cycle of:
pulsing a second metal precursor comprising a magnesium ALD precursor for a second metal precursor pulse time, forming a second adsorbed entity on the W or Mo coating;
purging the reactor of the second metal precursor;
pulsing an oxidizing precursor into the reactor for a oxidizing precursor pulse time, the oxidizing precursor reacting with the first adsorbed entity; and
purging the reactor of the co-reactant precursor.

11. The method of claim 10, wherein depositing the W or Mo coating has a thickness of about 5-1000 nm.

12. The method of claim 11, wherein depositing the top coat comprises a thickness of at least 1-100 nm.

13. The method of claim 10, wherein the second metal precursor is selected from the group consisting of magnesocene $(Mg(Cp)_2)$, $Mg(C_5H_5)_2$, $Mg(C_5H_4Me)_2$, $Mg(C_5H_4Et)_2$, octamethyl magnesum-dialuminum $(MgAl_2(CH_3)_8)$, magnesium borohydride $(Mg(BH_4)_2)$, bis(ketoiminato)magnesium(II) complexes of composition [Mg(OCR$^2$CH$_2$CHR$^1$NCH$_2$CH$_2$X)$_2$] (X=NMe$_2$: R$^1$=R$^2$=Me; R$^1$=Me, R$^2$=Ph. X=OMe; R$^1$=R$^2$=Me), [MgMe(OtBu)]$_4$, Mg(dmto)$_2$, Mg(tmhd)$_2$(tmeda), [Mg(tmhd)$_2$]$_2$, and Mg(acac)$_2$.

14. The method of claim 10, wherein the wire mesh substrate is stainless steel.

15. The method of claim 10, wherein the wire mesh substrate comprises wires having a spacing therebetween of 20-100 microns.

16. The method of claim 10, the wire mesh has a wire diameter of 10-50 microns.

\* \* \* \* \*